United States Patent
Magnus et al.

(10) Patent No.: US 9,346,671 B2
(45) Date of Patent: May 24, 2016

(54) SHIELDING MEMS STRUCTURES DURING WAFER DICING

(71) Applicant: FREESCALE SEMICONDUCTOR, INC., Austin, TX (US)

(72) Inventors: Alan J. Magnus, Gilbert, AZ (US); Chad S. Dawson, Queen Creek, AZ (US); Stephen R. Hooper, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 12 days.

(21) Appl. No.: 14/172,479

(22) Filed: Feb. 4, 2014

(65) Prior Publication Data

US 2015/0217998 A1 Aug. 6, 2015

(51) Int. Cl.
*B81B 7/00* (2006.01)
*B81C 1/00* (2006.01)
*H01L 21/683* (2006.01)

(52) U.S. Cl.
CPC .......... *B81C 1/00896* (2013.01); *B81B 7/0058* (2013.01); *B81C 1/00865* (2013.01); *H01L 21/6836* (2013.01); *B81B 2201/0264* (2013.01); *B81B 2203/0127* (2013.01)

(58) Field of Classification Search
CPC ..................... B81B 7/0058; B81B 2203/0127; B81C 1/00865
See application file for complete search history.

(56) References Cited

U.S. PATENT DOCUMENTS

| | | | | |
|---|---|---|---|---|
| 5,389,182 A * | 2/1995 | Mignardi | | 156/701 |
| 5,668,033 A * | 9/1997 | Ohara et al. | | 438/113 |
| 5,814,885 A * | 9/1998 | Pogge et al. | | 257/730 |
| 6,255,741 B1 * | 7/2001 | Yoshihara et al. | | 257/792 |
| 6,420,206 B1 * | 7/2002 | Le et al. | | 438/68 |
| 6,555,417 B2 * | 4/2003 | Spooner et al. | | 438/113 |
| 6,624,921 B1 * | 9/2003 | Glenn et al. | | 359/291 |
| 6,750,083 B2 * | 6/2004 | Silverbrook | | 438/113 |
| 6,759,273 B2 | 7/2004 | Felton et al. | | |
| 7,297,567 B2 * | 11/2007 | Loeppert | | 438/48 |
| 7,316,965 B2 * | 1/2008 | Hooper et al. | | 438/460 |
| 7,651,881 B2 * | 1/2010 | Takasaki et al. | | 438/64 |
| 8,236,611 B1 * | 8/2012 | Anderson et al. | | 438/113 |
| 2002/0115234 A1 * | 8/2002 | Siniaguine | | 438/107 |
| 2005/0254673 A1 * | 11/2005 | Hsieh et al. | | 381/175 |
| 2006/0105546 A1 * | 5/2006 | Genda et al. | | 438/463 |
| 2009/0085186 A1 * | 4/2009 | Meyer | | 257/690 |
| 2010/0207227 A1 * | 8/2010 | Meyer-Berg | | 257/433 |
| 2011/0156176 A1 * | 6/2011 | Huckabee et al. | | 257/414 |
| 2011/0221042 A1 * | 9/2011 | Karlin et al. | | 257/620 |
| 2013/0084661 A1 * | 4/2013 | Yasuda | | 438/15 |

(Continued)

OTHER PUBLICATIONS

Beeby, S. "MEMS Mechanical Sensors" copyright 2004 pp. 135 and 136.*

*Primary Examiner* — Matthew Landau
*Assistant Examiner* — Grant Withers
(74) *Attorney, Agent, or Firm* — Charlene R. Jacobsen

(57) ABSTRACT

A MEMS wafer (46) includes a front side (52) having a plurality of MEMS structure sites (60) at which MEMS structures (50) are located. A method (40) for protecting the MEMS structures (50) includes applying (44) a non-active feature (66) on the front side of the MEMS wafer in a region that is devoid of the MEMS structures and mounting (76) the front side of the MEMS wafer in a dicing frame (86) such that a back side (74) of the MEMS wafer is exposed. The MEMS wafer is then diced (102) from the back side into a plurality of MEMS dies (48).

16 Claims, 5 Drawing Sheets

(56) References Cited

U.S. PATENT DOCUMENTS

2013/0140656 A1* 6/2013 Pahl et al. .................... 257/416
2013/0214365 A1* 8/2013 Schlarmann et al. ......... 257/415
2013/0302969 A1* 11/2013 Priewasser .................... 438/458

* cited by examiner

SHIELDING MEMS STRUCTURES DURING WAFER DICING

TECHNICAL FIELD OF THE INVENTION

The present invention relates generally to the processing of microelectromechanical systems (MEMS) devices. More specifically, the present invention relates to protecting MEMS structures on a MEMS wafer during wafer dicing.

BACKGROUND OF THE INVENTION

Microelectronic and microelectromechanical systems (MEMS) technology has achieved wide popularity in recent years, as it provides a way to make very small electronic and mechanical structures and integrate these structures on a single substrate using conventional batch semiconductor processing techniques. While such microelectronic and MEMS devices are becoming mainstream technologies, cost effectively protecting the delicate MEMS structures from damage and/or contamination during wafer processing remains challenging.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Figure 1:
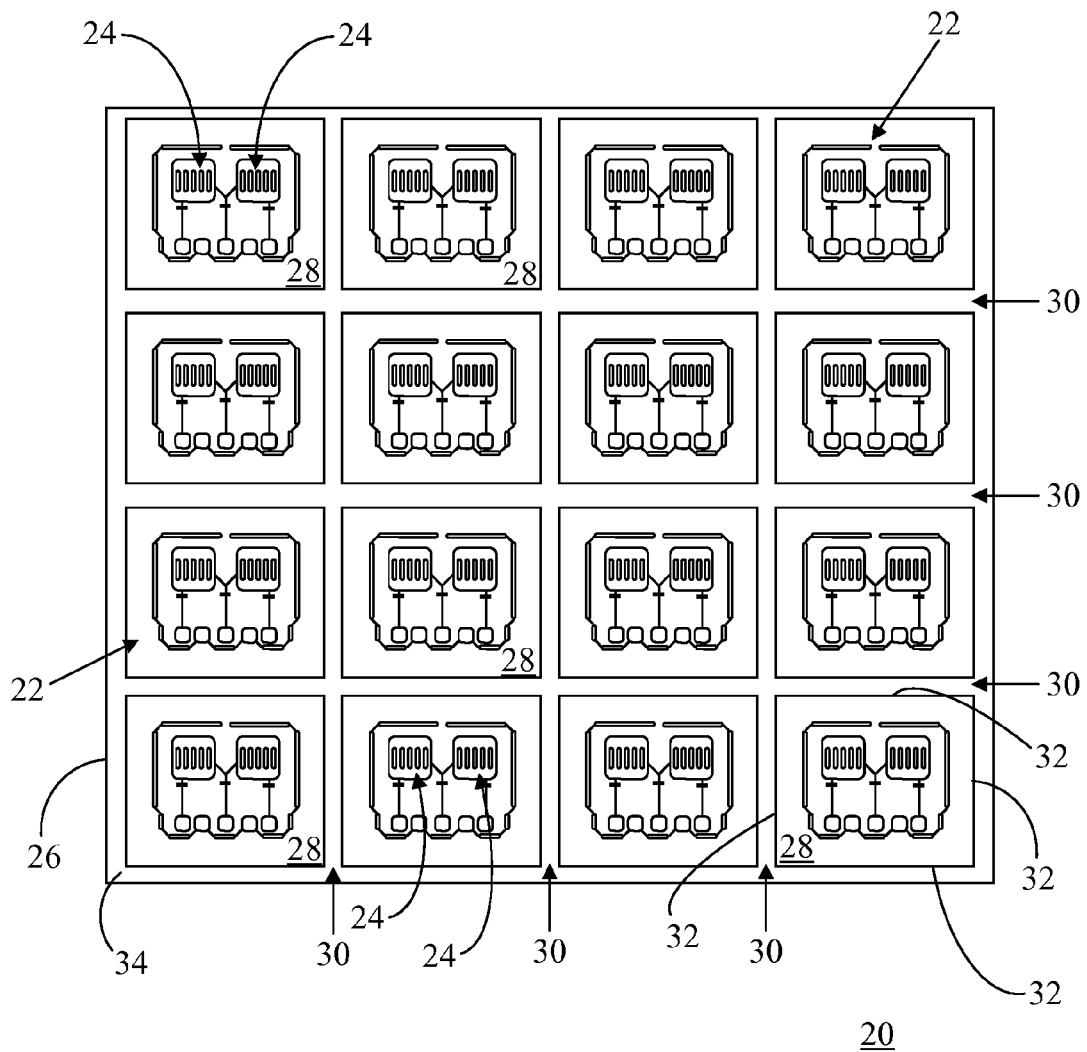
FIG. 1 shows a partial top view of a microelectromechanical systems (MEMS) wafer.
Figure 2:
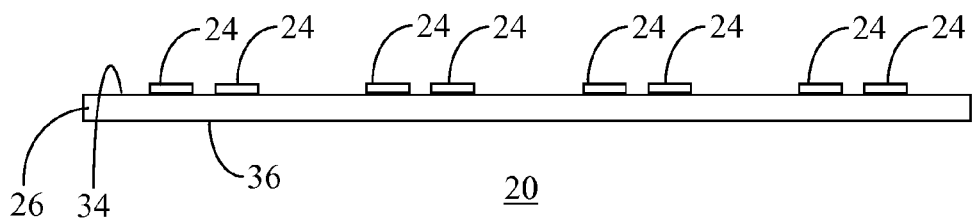
FIG. 2 shows a partial side view of the MEMS wafer of FIG. 1.

Referring to FIGS. 1 and 2, FIG. 1 shows a partial top view of a microelectromechanical systems (MEMS) wafer 20 and FIG. 2 shows a partial side view of MEMS wafer 20. MEMS wafer 20 is typically fabricated to include a plurality of MEMS dies 22, each of which includes one or more MEMS structures 24 formed on, for example, a silicon wafer 26. These MEMS structures 24 perform a particular function in accordance with particular design requirements. MEMS dies 22 are typically arranged in a grid pattern of MEMS structure sites 28, and the sections of MEMS wafer 20 between the individual MEMS dies 22 are termed scribe streets 30, or scribe streets. Scribe streets 30 are areas of MEMS wafer 20 where no active component of MEMS structures 24 has been placed and which define a perimeter 32, or boundary, of each MEMS structure site 28.

MEMS structures 24 typically appear on only one surface, referred to herein as a front side 34, of MEMS wafer 20. The opposing surface, referred to herein as a back side 36, of MEMS wafer 20 may be devoid of structures or patterns. The individual MEMS dies 22 are removed from MEMS wafer 20 by sawing or dicing MEMS wafer 20 along all of scribe streets 30, thus physically separating MEMS wafer 20 along both axes into individual, or singulated, MEMS dies 22.

An industry standard practice for separating MEMS wafer 20 into individual MEMS dies 22 entails securing MEMS wafer 20 onto dicing tape, or film, and into a film frame with front side 34 containing MEMS structure 24 exposed and facing upward. The film frame is placed on a movable chuck in a sawing station. The chuck and MEMS wafer 20 is then advanced under a saw blade to dice, or cut, MEMS wafer 20 from front side 34 along scribe streets 30. During the dicing process, water is jet sprayed over front side 34 of MEMS wafer 20, as well as over the surface of the saw blade to cool MEMS wafer 20 and the saw blade. After the dicing operation, the diced MEMS wafer 20 is transported to a cleaning station where it can be rinsed with de-ionized water and, in some cases, brushed, to clear away any remaining slurry created by the dicing operation. The diced MEMS wafer 20 is then dried after the water flow and brushing operations are complete.

After cleaning, the film frame containing the now singulated MEMS dies 22 is transported to a pick-and-place station where the individual MEMS dies 22 are to be removed from the film frame. The pick-and-place station removes the individual MEMS dies from the film frame and places them, for example, into a carrier. The MEMS dies 22 can then be delivered in the carrier to the next station for further processing.

Each MEMS die 22 may contain any type and combination of MEMS structures 24 including, but not limited to, movable masses for accelerometers and gyroscopes, sense diaphragms for pressure sensors, switches, optical mirrors, and so forth. Each MEMS die 22 may also include other circuitry associated with MEMS structures 24. When MEMS dies 22 are fabricated, the circuitry portion of MEMS dies 22 may be coated with a passivation layer to protect it. However, MEMS structures 24 cannot be passivated since they must be able to move freely in response to a particular stimulus.

MEMS structures 24 are very fragile and great care must be taken during fabrication and packaging so that MEMS structures 24 are not damaged or contaminated. Unfortunately, the water jet spray used during a dicing process can damage the delicate MEMS structures 24. Those MEMS structures 24 that survive the water jet spray may subsequently be damaged during the ensuing rinsing and/or brushing that occurs during the cleaning process. For example, when MEMS structures 24 are sense diaphragms for pressure sensors, experimentation has shown a direct correlation between fractures in the sense diaphragms and the impact of saw cut water and/or rinse water onto the MEMS die 22 surface, i.e., front side 34.

Some effort has been directed toward dicing MEMS wafer 20 from back side 36. That is, front side 34 of MEMS wafer 20 containing MEMS structures 24 is placed face down onto dicing tape or film of a film frame and loaded into a movable saw chuck. The chuck and MEMS wafer 20 is then advanced under a saw blade to dice, or cut, MEMS wafer 20 from back side 36. By dicing MEMS wafer 20 from back side 36, damage from the impact of the jet spray water or rinse water may be avoided. However, a significant number of MEMS structures 24 can still be damaged during a back side dicing process. For example, when MEMS structures 24 are sense diaphragms for pressure sensors, the sense diaphragms can be damaged due to contact of the sense diaphragms with the dicing tape used with the film frame and during the subsequent removal of the dicing tape.

Accordingly, embodiments entail a method and structure for shielding MEMS structures during dicing of a MEMS wafer in order to protect the MEMS structures from damage and particle contamination during a wafer dicing process. In particular, embodiments entail a fabrication operation in which a non-active feature, in the form of a polyimide or nitride film is applied to suitable regions on the MEMS wafer that are devoid of MEMS structures. This non-active feature protrudes above the plane of the MEMS structures such that even with significant force from a roller at dicing tape application or due to the downward pressure caused by the cutting force during a back side dicing process, the MEMS structures will not contact the dicing tape. Thus, the method and structure yield cost effective means for protecting the delicate MEMS structures from damage and/or contamination during wafer dicing.

Figure 3:
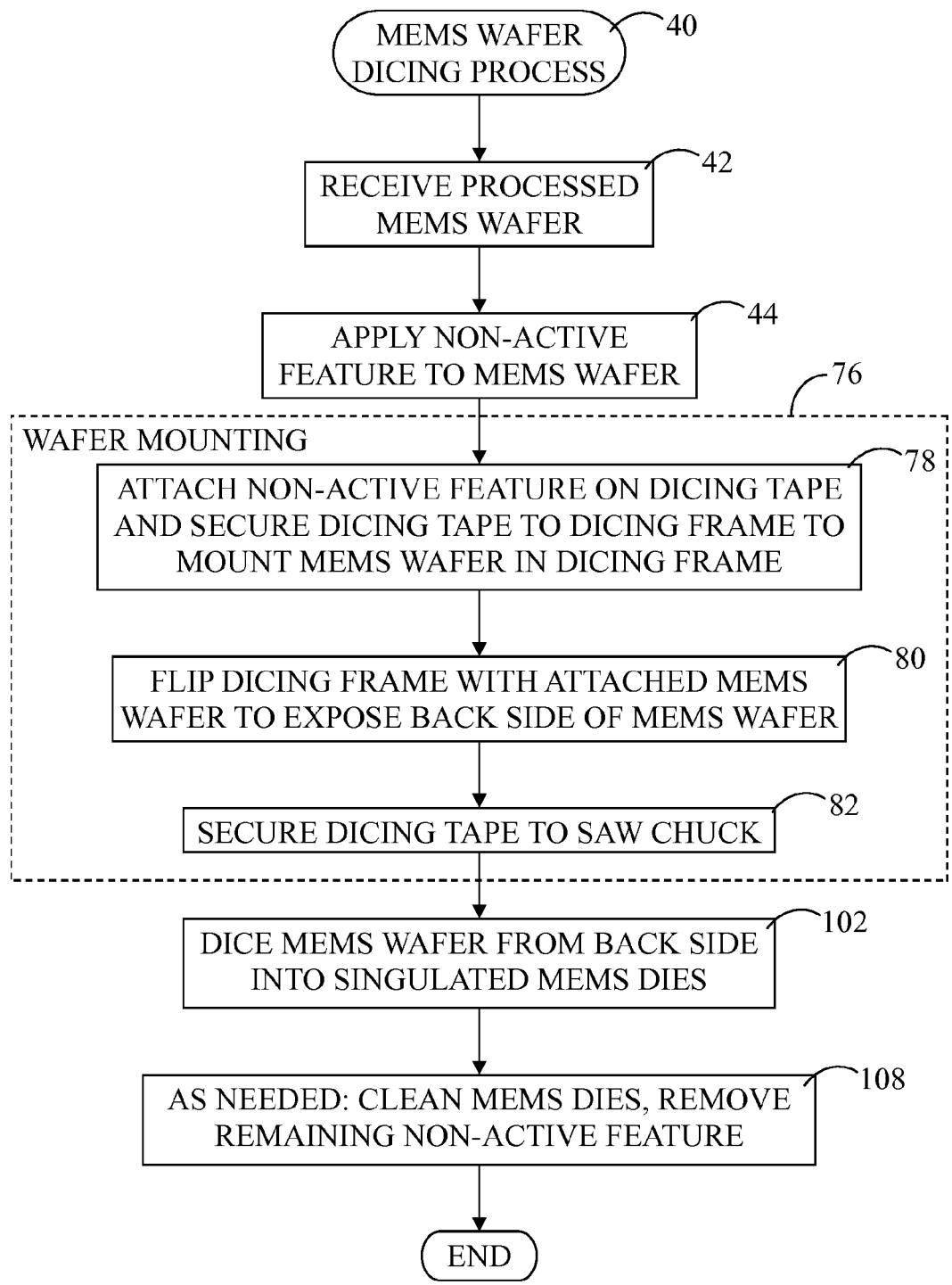
FIG. 3 shows a flowchart of a MEMS wafer dicing process in accordance with an embodiment.

FIG. 3 shows a flowchart of a MEMS wafer dicing process 40 in accordance with an embodiment. MEMS wafer dicing process 40 enables the dicing of a MEMS wafer into a plurality of MEMS dies while effectively protecting the fragile MEMS structures during the dicing process, and thereby increasing yield.

MEMS wafer dicing process 40 begins with a task 42. At task 42, a processed MEMS wafer is received. The MEMS wafer may be received from another manufacturing facility that originally fabricated the MEMS wafer, and is received at the facility that will be performing subsequent dicing and post processing activities. Alternatively, the MEMS wafer may be fabricated at the facility that is additionally performing the dicing and post processing activities.

In response to task 42, a task 44 is performed. At task 44, a non-active feature is applied to the received MEMS wafer.

Figure 4:
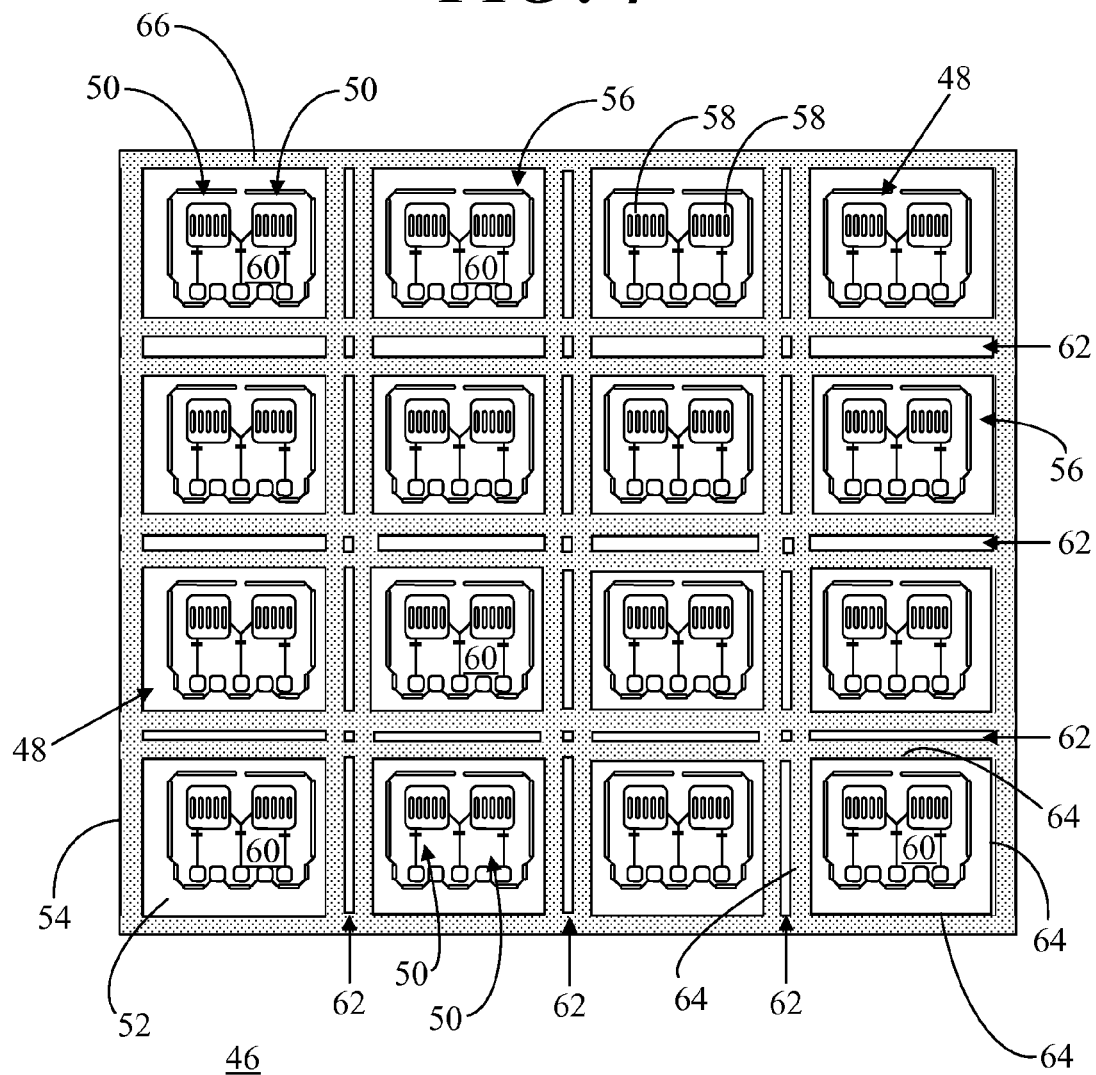
FIG. 4 shows a partial top view of a MEMS wafer in accordance with another embodiment.
Figure 5:
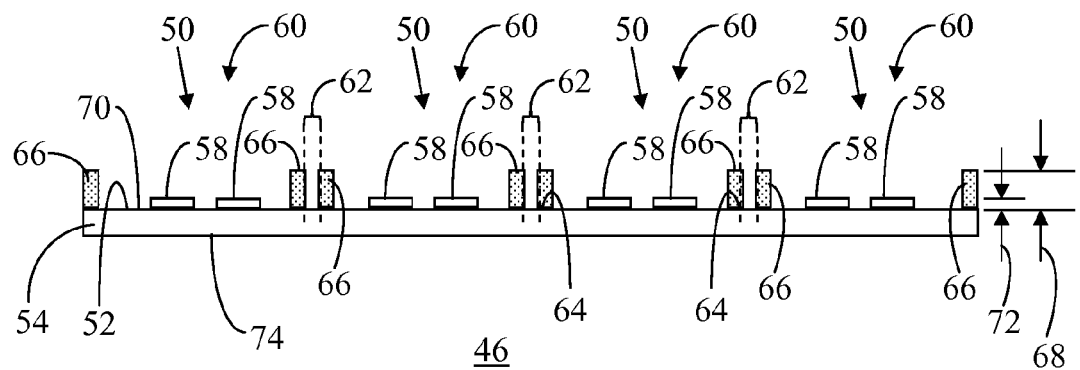
FIG. 5 shows a partial side view of the MEMS wafer of FIG. 4.

Referring to FIGS. 4 and 5 in connection with tasks 42 and 44, FIG. 4 shows a partial top view of a MEMS wafer 46 in accordance with another embodiment, and FIG. 5 shows a partial side view of MEMS wafer 46. MEMS wafer 46 is fabricated to include a plurality of MEMS dies 48, each of which includes one or more MEMS structures 50 formed on a front side 52 of a silicon wafer 54. In an exemplary embodiment, MEMS structures 50 include pressure sensors 56 having sense diaphragms 58. However, alternative embodiments may include any of a variety of MEMS structures 50 in accordance with a particular design. Additionally, only a few MEMS structures 50 are shown for simplicity of illustration. Those skilled in the art will recognize that MEMS wafer 46 may include any number of MEMS dies 48 dictated by particular design and size constraints.

MEMS dies 48 are arranged in a grid pattern of MEMS structure sites 60, separated by scribe streets 62. That is, scribe streets 62 delineate a perimeter 64, or boundary, of each MEMS structure site 60. MEMS wafer 46 including MEMS dies 48 may be fabricated or otherwise received at task 42. In FIG. 5, scribe streets 62 are represented by vertically oriented dashed lines between individual MEMS structure sites 60.

In accordance with task 44, a non-active feature 66 (represented by a stippled pattern in FIGS. 4 and 5) is applied on front side 52 of MEMS wafer 46. Non-active feature 66 may be a polyimide thin film layer, a nitride thin film layer, or a stacked arrangement of material layers, such as, both nitride film and polyimide film. In other embodiments, non-active feature 66 may be any photodefinable material such as, for example, a benzo-cyclo-butene (BCB)-based polymer dielectric, poly-benzo-oxazole (PBO), epoxy-based material, and so forth.

Non-active feature 66 may be applied using a conventional application technique at any suitable regions that are devoid of MEMS structures 50. For example, non-active feature 66 may be applied at perimeter 64 of each of MEMS structure sites 60 surrounding MEMS structures 50 and/or inboard from perimeter 64. Alternatively, or additionally, at least a portion of non-active feature 66 may be placed in scribe streets 62, as shown in FIG. 5. In some embodiments, non-active feature 66 may be placed entirely within scribe streets 62. And in still other embodiments, non-active feature may be applied at some, but not all, perimeters 64 and/or in some, but not all, scribe streets 62.

Following application of non-active feature 66 to MEMS wafer 46, non-active feature 66 exhibits a height 68 above a surface 70 of front side 52 of MEMS wafer 46. MEMS structures 50, and particularly sense diaphragms of 58 of pressure sensors 56 may exhibit a height 72 above surface 70 of front side 52. In accordance with a particular embodiment, height 68 of non-active feature 66 above surface 70 is greater than height 72 of sense diaphragms 58 above surface 70. Of course, when sense diaphragms are insubstantially the same plane as surface 70 of front side 52, i.e., height 72 is zero, then height 68 of non-active feature 66 will still be significantly greater than zero. As will be discussed below, height 68 of non-active feature 66 is significantly greater than height 72 of sense diaphragms 58 so that non-active feature 66 can protect or otherwise shield sense diaphragms 58 during a wafer dicing operation from a back side 74 of MEMS wafer 46.

Referring back to FIG. 3, following task 44, MEMS wafer dicing process 40 continues with wafer mounting subprocess 76, delineated by a dashed line box, in which front side 52 of MEMS wafer 46 is mounted in a dicing frame such that back side 74 of MEMS wafer 46 is exposed. A series of tasks 78, 80, and 82 are performed in accordance with wafer mounting subprocess 76.

At task 78, non-active feature 66 (FIG. 4) is attached on dicing tape and the dicing tape is secured to a dicing frame in order to mount MEMS wafer 46 in the dicing frame.

Figure 6:
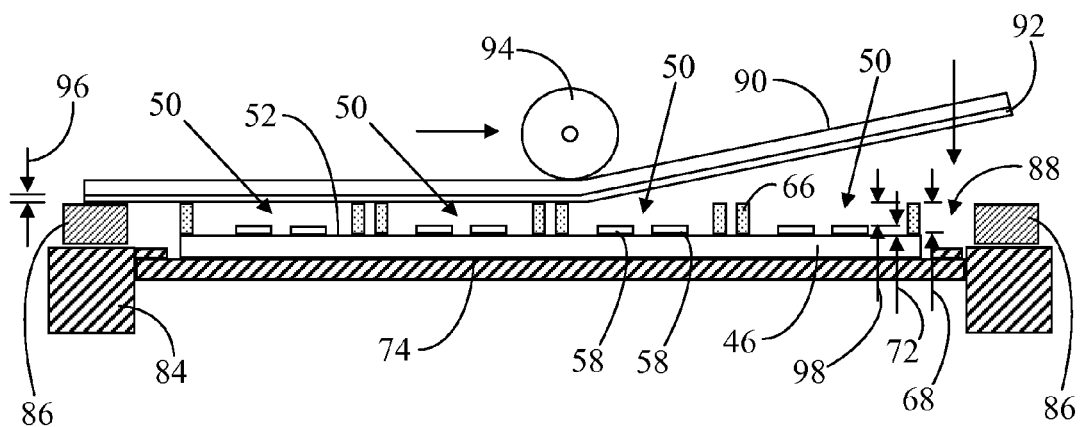
FIG. 6 shows a side view of the MEMS wafer of FIG. 4 during processing in accordance with the MEMS wafer dicing process of FIG. 3.

Referring to FIG. 6 in connection with task 78, FIG. 6 shows a side view of MEMS wafer 46 during processing in accordance with task 78 of MEMS wafer dicing process 40. As exemplified in FIG. 6, back side 74 of MEMS wafer 46 is placed in a taping structure 84 with front side 52 of MEMS wafer 46 facing upwardly. A dicing frame 86 having an opening 88 is laid over MEMS wafer 46 with MEMS wafer 46 being within the perimeter of dicing frame 86. A plastic film, referred to herein as a dicing tape 90 is laid over dicing frame 86 and front side 52 of MEMS wafer 46.

Dicing tape 90 typically includes an adhesive layer 92 on the side that contacts dicing frame 86 and MEMS wafer 46. Force is then applied to dicing tape 90 via, for example, a rolling cylinder 94, to attach dicing tape 90 to non-active features 66 formed on front side 52 of MEMS wafer 46 and to secure dicing tape 90 to dicing frame 86. MEMS wafer 46 is now mounted to dicing tape 90 that, in turn, is mounted to dicing frame 86.

In accordance with an embodiment, height 68 of non-active features 66 prevents contact of the active components of MEMS structures 50, and more particularly, sense diaphragms 58 with dicing tape 90 when force is applied via rolling cylinder 94 to attach dicing tape 90 to non-active features 66. In some embodiments, adhesive layer 92 may have an adhesive thickness 96 that is no greater than a difference 98 between height 68 of non-active features 66 and height 72 of sense diaphragms 58. As such, the force applied via rolling cylinder 94 cannot compress adhesive layer 92 enough so that adhesive layer 92 of dicing tape 90 can then become adhered to sense diaphragms 58. Accordingly, even with significant force from rolling cylinder 94 during application of dicing tape 90, sense diaphragms 58 are unlikely to come into contact with adhesive layer 92 of dicing tape 90.

Referring back to FIG. 3, following task 78, MEMS wafer dicing process 40 continues with task 80. At task 80, dicing frame 86 with the attached MEMS wafer 46 is flipped to expose back side 74 of MEMS wafer 46.

Figure 7:
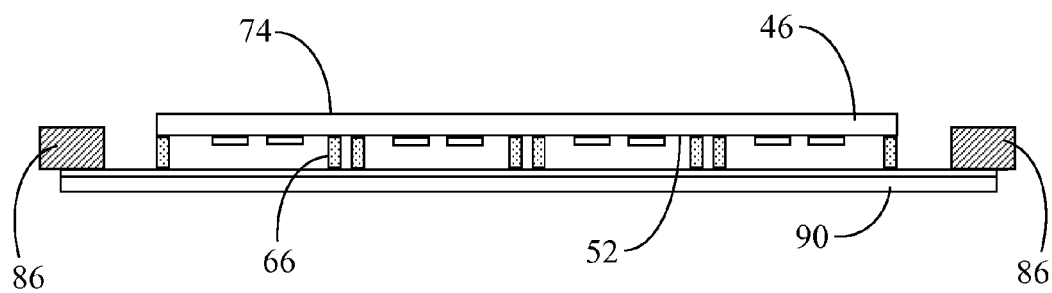
FIG. 7 shows a side view of the MEMS wafer of FIG. 6 during a subsequent stage of processing.

With reference to FIG. 7 in connection with task 80, FIG. 7 shows a side view of MEMS wafer 46 during a subsequent stage of processing. In particular, FIG. 7 shows dicing frame 86 with the attached MEMS wafer 46 removed from taping structure 84 (FIG. 6) and flipped so that dicing tape 90 is facing downwardly, and back side 74 of MEMS wafer 46 is facing upwardly and is exposed.

Now returning to FIG. 3, task 82 is performed following task 80. At task 82, dicing tape 90 is secured to a movable saw chuck.

Figure 8:
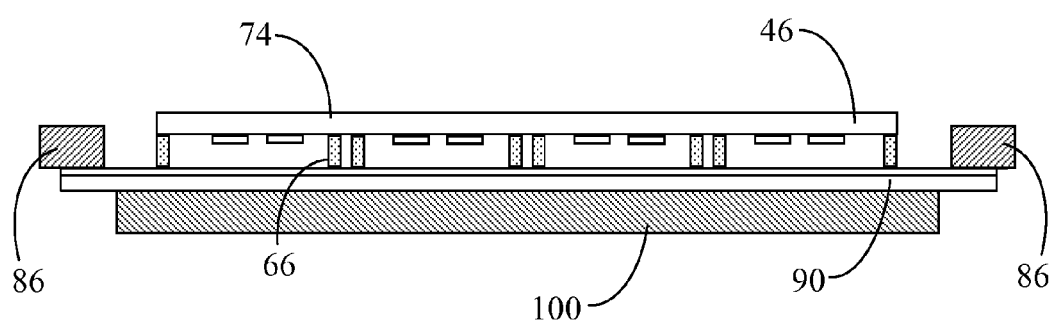
FIG. 8 shows a side view of the MEMS wafer of FIG. 7 during a subsequent stage of processing.

Referring to FIG. 8 in connection with task 82, FIG. 8 shows a side view of MEMS wafer 46 during a subsequent stage of processing. In particular, FIG. 8 shows dicing tape 90 with dicing frame 86 and MEMS wafer 46 placed on a movable saw chuck 100. Dicing tape 90 may be secured to saw chuck 100 via vacuum and/or, in some instances via an adhesive material (not shown) present on either of saw chuck 100 or on dicing tape 90. Dicing tape 90 and dicing frame 86 may alternatively be secured to saw chuck 100 by other means.

With reference back to FIG. 3, after MEMS wafer 46 is secured to saw chuck 100 with back side 74 exposed, a task 102 is performed. At task 102, MEMS wafer 46 undergoes a back side dice process in order to produce singulated, i.e., individual, MEMS dies 48.

Figure 9:
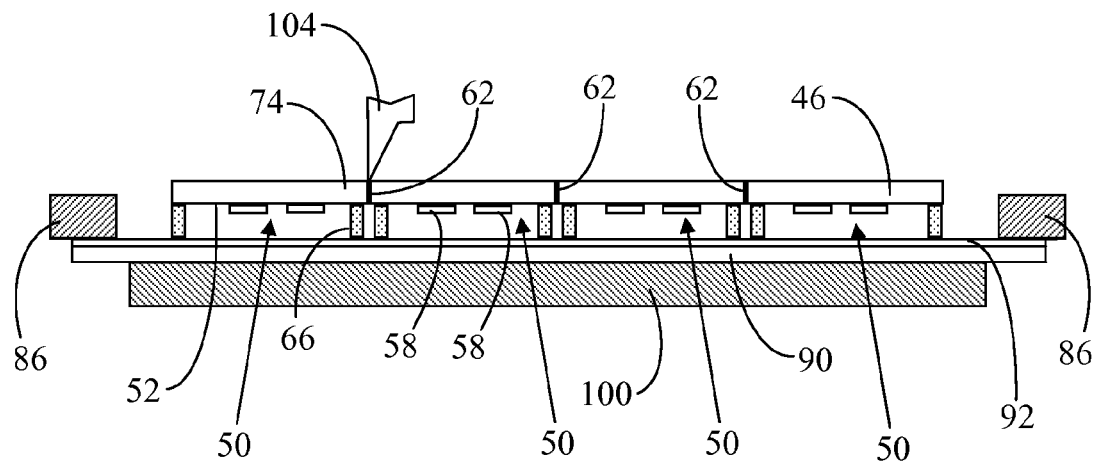
FIG. 9 shows a side view of the MEMS wafer of FIG. 8 during a subsequent stage of processing.

Referring to FIG. 9 in connection with task 102, FIG. 9 shows a side view of MEMS wafer 46 during a subsequent stage of processing. In particular, FIG. 9 generally shows a saw blade 104 of a conventional sawing machine dicing, cutting, or otherwise sawing MEMS wafer 46 from back side 74 along scribe streets 62. MEMS wafer 46 may include indicia on back side 74 or some other alignment key corresponding with scribe streets 62. The sawing machine may include a camera and a computerized optical system using optical pattern recognition software to control movement of saw chuck 100 so as to align scribe streets 62 on MEMS wafer 46 with saw blade 104. However, the movement of saw chuck 100 may alternatively be controlled manually, and saw chuck 100 and MEMS wafer 46 may then be advanced under saw blade 104 to dice through MEMS wafer 46 at scribe streets 62.

Due to the presence of non-active features 66 applied to front side 52 of MEMS wafer 46 and adhered to dicing tape 90, even with significant force applied by saw blade 104 during dicing task 102, sense diaphragms 58 of MEMS structures 50 are unlikely to come into contact with adhesive layer 92 of dicing tape 90. After dicing task 102, the diced MEMS wafer 46, now in the form of individual MEMS dies 48 may be transported to a cleaning station where back side 74 can be rinsed with de-ionized water, brushed to clear away any remaining slurry created by the dicing operation, and dried. Accordingly, inclusion of non-active features 66 and the back side dicing operations may largely prevent damage to sense diaphragms 58. Moreover, any water jet spray on back side 74 of MEMS wafer 46 during dicing and rinsing cannot directly impact and potentially damage the fragile sense diaphragms 58 during execution of dicing task 102.

After cleaning back side 74, dicing frame 86 and dicing tape 90 containing the now singulated MEMS dies 48 may be transported to a pick-and-place station where the individual MEMS dies 48 can be removed from dicing tape 90. The pick-and-place station may remove the individual MEMS dies 48 from dicing tape 90, flip them, and place them, for example, into a carrier (not shown). MEMS dies 48 may then be delivered in the carrier to the next station for further processing.

Figure 10:
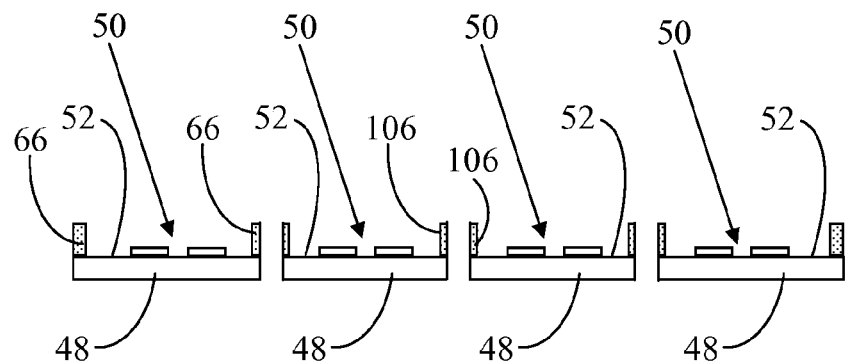
FIG. 10 shows a side view of singulated MEMS dies following dicing of the MEMS wafer of FIG. 4 in accordance with the MEMS wafer dicing process of FIG. 3.

FIG. 10 shows a view of singulated MEMS dies 48 following dicing of MEMS wafer 46 (FIG. 9) at task 102 of MEMS wafer dicing process 40 (FIG. 3). In this illustration, the singulated MEMS dies 48 have been flipped so that front side 52 of each of MEMS dies 48 containing MEMS structures 50 faces upwardly. As shown, a portion 106 of non-active features 66 may remain attached to front side 52 of at least some of the singulated MEMS dies 48. Since this portion 106 of non-active features 66 is located in areas where there are no functional components of MEMS dies 48, it may optionally remain on front side 52.

Returning back to FIG. 3, a task 108 may be performed following dicing task 102 of MEMS wafer dicing process 40. In a preferred embodiment, portion 106 (FIG. 10) of non-active features 66 will permanently remain on front side 52 of MEMS dies 48 because come materials that form non-active features 66 may be difficult to effectively remove. Furthermore, non-active features are positioned on front side 52 at locations that are devoid of MEMS structure 50 (FIG. 10). Nevertheless, in some embodiments, it may be desirable to remove non-active features 66 following dicing. Accordingly, task 108 may be performed to remove the polyimide or nitride film that forms non-active features 66. Following task 108, MEMS wafer dicing process 40 ends.

Figure 11:
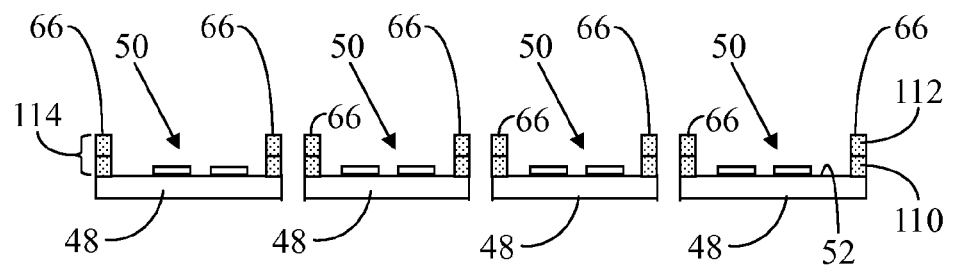
FIG. 11 shows a side view of the MEMS dies in accordance with an alternative embodiment.

Now referring to FIG. 11, FIG. 11 shows a view of MEMS dies 48 in accordance with an alternative embodiment. As mentioned above in connection with task 44 (FIG. 3), non-active feature 66 may be a stacked arrangement of material layers. As shown in FIG. 11, the remaining portion of non-active features 66 includes a material layer 110 that is applied to front side 52 of MEMS wafer 46 (FIG. 4) during execution of task 44, and another material layer 112 that is applied to material layer 110 during execution of task 44 to form a stacked arrangement 114 of material layers 110 and 112. That is, in accordance with some embodiments, task 44 entails applying material layer 110 of non-active features 66 on front side 52 of MEMS wafer 46, and applying material layer 112 of non-active features 66 on material layer 110 to form stacked arrangement 114 of material layers 110, 112. In an example, material layer 110 may be a nitride film layer and material layer 112 may be a polyimide layer, although other suitable materials may be utilized. Stacked arrangement 114 of two or more materials can yield the necessary height for non-active features 66 such that even with significant force from a roller at dicing tape application or due to the downward pressure caused by the cutting force during a back side dicing process, MEMS structures 50 are unlikely to contact the dicing tape.

It is to be understood that certain ones of the process blocks depicted in FIG. 3 may be performed in parallel with each other or with performing other processes. In addition, it is to be understood that the particular ordering of the process blocks depicted in FIG. 3 may be modified, while achieving substantially the same result. Accordingly, such modifications are intended to be included within the scope of the inventive subject matter. In addition, although particular system configurations, including particular MEMS structures, are discussed in conjunction with FIGS. 4 and 5, above, embodiments may be implemented in MEMS wafers having other MEMS structure architectures, as well. These and other variations are intended to be included within the scope of the inventive subject matter.

Various embodiments entail a method and structure for shielding MEMS structures during dicing of the MEMS wafer in order to protect the MEMS structures from damage and particle contamination during a wafer dicing process. In particular, embodiments entail a fabrication operation in which a non-active feature is applied on the front side of a MEMS wafer at a one or more regions that are devoid of the MEMS structures. This non-active feature protrudes above the plane of the MEMS structures such that even with significant force from a roller at dicing tape application or due to the downward pressure caused by the cutting force during a back side dicing process, the MEMS structures will not contact the dicing tape. Thus, inclusion of the non-active feature on the front side of the MEMS wafer advantageously serves to largely prevent damage to the MEMS structures formed on the front side of the MEMS wafer during back side dicing operations. Consequently, the method and structure yield cost effective means for protecting the delicate MEMS structures from damage and/or contamination during wafer dicing.

While the principles of the inventive subject matter have been described above in connection with specific structure and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method for protecting microelectromechanical systems (MEMS) structures on a MEMS wafer, said MEMS wafer including a front side having a plurality of MEMS structure sites at which said MEMS structures are located, and said method comprising:
applying a non-active feature on said front side of said MEMS wafer at a region of said MEMS wafer that is devoid of said MEMS structures, wherein said non-active feature comprises a nitride film;
mounting said front side of said MEMS wafer in a dicing frame such that a back side of said MEMS wafer is exposed; and
dicing said MEMS wafer from said back side into a plurality of MEMS dies.

2. A method as claimed in claim 1 wherein said applying operation includes placing said non-active feature at a perimeter of each of said MEMS structure sites.

3. A method as claimed in claim 1 wherein said applying operation includes placing at least a portion of said non-active feature in a scribe street of said MEMS wafer.

4. A method as claimed in claim 1 wherein said applying operation comprises:
applying a first material layer of said non-active feature on said front side of said MEMS wafer; and
applying a second material layer of said non-active feature on said first material layer to form a stacked arrangement of said first and second material layers.

5. A method as claimed in claim 1 wherein said non-active feature has a first height above a surface of said front side of said MEMS wafer that is greater than a second height of said MEMS structures above said surface.

6. A method as claimed in claim 5 wherein said mounting operation comprises attaching said non-active feature to a dicing tape, said first height of said non-active feature preventing contact of said MEMS structures with said dicing tape during said attaching operation.

7. A method as claimed in claim 6 wherein said first height of said non-active feature prevents contact of said MEMS structures with said dicing tape during said dicing operation.

8. A method as claimed in claim 6 wherein said dicing tape includes an adhesive layer attachable to said non-active feature, said adhesive layer having an adhesive thickness that is no greater than a difference between said first height and said second height.

9. A method as claimed in claim 1 wherein following said dicing operation, at least a portion of said non-active feature remains attached to said front side of said MEMS wafer, and said method further comprises leaving said remaining portion of said non-active feature intact on said front side of said MEMS wafer.

10. A method as claimed in claim 1 wherein said MEMS structures include pressure sensors having sense diaphragms located in said MEMS structure sites, and said non-active feature prevents said sense diaphragms from contacting an underlying surface during said mounting and dicing operations.

11. A method for protecting microelectromechanical systems (MEMS) structures on a MEMS wafer, said MEMS wafer including a front side having a plurality of MEMS structure sites at which said MEMS structures are located, and said method comprising
applying a non-active feature on said front side of said MEMS wafer at a perimeter of said MEMS structure sites in a scribe street of said MEMS wafer, said non-active feature having a first height above a surface of said front side of said MEMS wafer that is greater than a second height of said MEMS structures above said surface;
mounting said front side of said MEMS wafer in a dicing frame such that a back side of said MEMS wafer is exposed, said mounting operation including attaching said non-active feature to a dicing tape, said dicing tape including an adhesive layer attachable to said non-active feature, said adhesive layer having an adhesive thickness that is no greater than a difference between said first height and said second height, wherein said first height of said non-active feature prevents contact of said MEMS structures with said dicing tape during said attaching operation; and
dicing said MEMS wafer from said back side into a plurality of MEMS dies.

12. A method as claimed in claim 11 wherein said first height of said non-active feature prevents contact of said MEMS structures with said dicing tape during said dicing operation.

13. A method as claimed in claim 11 wherein said applying operation comprises:
applying a first material layer of said non-active feature on said front side of said MEMS wafer; and
applying a second material layer of said non-active feature on said first material layer to form a stacked arrangement of said first and second material layers.

14. A method for protecting microelectromechanical systems (MEMS) structures on a MEMS wafer, said MEMS wafer including a front side having a plurality of MEMS structure sites at which said MEMS structures are located, wherein said MEMS structures include pressure sensors having sense diaphragms located in said MEMS structure sites, and said method comprises:
applying a non-active feature on said front side of said MEMS wafer at a region of said MEMS wafer that is devoid of said MEMS structures, wherein said non-active feature comprises one of a polyimide film and a nitride film, and wherein said applying operation includes placing said non-active feature at a perimeter of each of said MEMS structure sites;
mounting said front side of said MEMS wafer in a dicing frame such that a back side of said MEMS wafer is exposed; and
dicing said MEMS wafer from said back side into a plurality of MEMS dies, said non-active feature preventing said sense diaphragms from contacting an underlying surface during said mounting and dicing operations.

15. A method as claimed in claim 14 wherein said non-active feature has a first height above a surface of said front side of said MEMS wafer that is greater than a second height of said MEMS structures above said surface.

16. A method as claimed in claim 14 wherein said applying operation further includes:
applying a first material layer of said non-active feature on said front side of said MEMS wafer; and
applying a second material layer of said non-active feature on said first material layer to form a stacked arrangement of said first and second material layers.

* * * * *